(12) United States Patent
Manning

(10) Patent No.: US 8,291,181 B2
(45) Date of Patent: Oct. 16, 2012

(54) TEMPORARY MIRRORING, LOGICAL SEGREGATION, AND REDUNDANT PROGRAMMING OR ADDRESSING FOR SOLID STATE DRIVE OPERATION

(75) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 722 days.

(21) Appl. No.: 12/259,363

(22) Filed: Oct. 28, 2008

(65) Prior Publication Data

US 2010/0106889 A1 Apr. 29, 2010

(51) Int. Cl.
*G06F 12/16* (2006.01)
(52) U.S. Cl. .......... 711/162; 711/161; 711/165; 711/173
(58) Field of Classification Search .................. None
See application file for complete search history.

(56) References Cited

U.S. PATENT DOCUMENTS

| | | | |
|---|---|---|---|
| 5,134,584 A | | 7/1992 | Boler et al. |
| 6,453,383 B1 * | | 9/2002 | Stoddard et al. ............ 711/112 |
| 2005/0262291 A1 | | 11/2005 | Siegelin et al. |
| 2005/0262388 A1 * | | 11/2005 | Dahlen et al. .................. 714/5 |
| 2006/0288177 A1 | | 12/2006 | Shaw |
| 2007/0168624 A1 | | 7/2007 | Kaler |
| 2008/0082741 A1 | | 4/2008 | Biessener et al. |
| 2008/0113525 A1 | | 5/2008 | Tzur |

FOREIGN PATENT DOCUMENTS
KR 10-2007-0074322 A 7/2007

OTHER PUBLICATIONS

International Search Report and Written Opinion for related PCT Application PCT/US2009/005617, dated May 28, 2010. (11 pgs.).
Dinkelman, Todd. "SSDs: A Shift in Data Storage," Micron Technology, Inc. Flash Memory Summit, Santa Clara, California, Aug. 2008, accessed at http://www.flashmemorysummit.com/English/Collaterals/Presentations/2008/20080812_F1B_Dinkelman.pdf. (26 pgs.).
Sykes, Justin. "Performance Productivity for Enterprise Applications," Micron Technology, Inc., accessed at http://download.micron.com/pdf/whitepapers/performance_productivity_for_ent_apps.pdf. (5 pgs.).
Sykes, Justin. "SSDs to Boost Data Center Performance," Micron Technology, Inc., accessed at http://download.micron.com/pdf/whitepapers/ssds_to_boost_data_center_performance.pdf. (5 pgs.).
Sykes, Justin. "Reducing Power Consumption in the Data Center with SSDs," Micron Technology, Inc., accessed at http://download.micron.com/pdf/whitepapers/reducing_power_consumption_ssds.pdf (8 pgs.).

* cited by examiner

*Primary Examiner* — Kevin Ellis
*Assistant Examiner* — Alan Otto
(74) *Attorney, Agent, or Firm* — Brooks, Cameron & Huebsch PLLC

(57) ABSTRACT

The present disclosure includes methods and devices for operating a solid state drive. One method embodiment includes mirroring programming operations such that data associated with a programming operation is programmed to two or more locations in memory of the solid state drive. The method also includes ceasing to mirror programming operations upon an occurrence of a particular event.

39 Claims, 4 Drawing Sheets

TEMPORARY MIRRORING, LOGICAL
SEGREGATION, AND REDUNDANT
PROGRAMMING OR ADDRESSING FOR
SOLID STATE DRIVE OPERATION

TECHNICAL FIELD

The present disclosure relates generally to semiconductor memory devices, methods, and systems, and more particularly, to operating a solid state drive.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Solid state memory devices are utilized as volatile and non-volatile memory for a wide range of electronic applications. Flash memory, which is just one type of solid state memory, typically uses a one-transistor memory cell that allows for high memory densities, high reliability, and low power consumption.

Solid state memory devices, including flash devices, can be combined together to form a solid state drive. A solid state drive can be used to replace hard disk drives as the main storage device for a computer, as the solid state drives can have advantages over hard drives in terms of performance, size, weight, ruggedness, operating temperature range, and power consumption. For example, flash solid state drives can have superior performance when compared to magnetic disk drives due to their lack of moving parts, which may ameliorate seek time, latency, and other electromechanical delays associated with magnetic disk drives.

A solid state drive is a data storage device that uses solid state memory to store persistent data. A solid state drive may include NAND flash non-volatile memory and/or DRAM volatile memory. Solid state drive manufacturers can use nonvolatile flash memory to create a drive that does not use an internal battery supply thus allowing the drive to be more versatile and compact. Solid state drives using flash memory, also known as flash drives, can use standard disk drive form factors (e.g., 1.8-inch, 2.5-inch, and 3.5-inch, among others).

For some storage applications, hard drives may be arranged in a redundant array, such as a redundant array of inexpensive disks, also referred to as a redundant array of independent disks (RAID). A RAID can refer to data storage systems that can divide and replicate data among multiple hard disk drives. Such arrangements, e.g., in servers, may be intended to prevent data loss in case a particular drive fails. However, this practice may involve a substantial investment in extra capacity that is not realized in system storage capacity. For example, in some storage applications, as little as 5-30% of a hard disk capacity is used for storage in order to increase performance by reducing seek times associated with the hard disk(s). Furthermore, hard drive failure rates may tend to increase as the drive ages. Solid state devices, conversely, may tend to fail early in life, if at all, and then operate correctly through the end of their expected service life.

DETAILED DESCRIPTION

Figure 1:
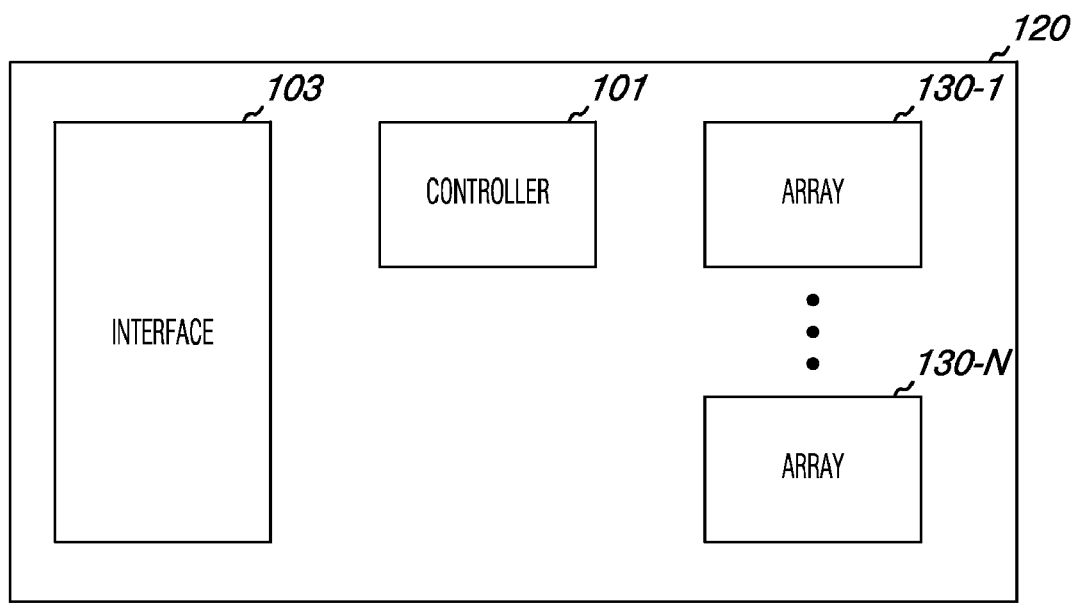
FIG. 1 illustrates a block diagram of a solid state drive in accordance with one or more embodiments of the present disclosure.

The present disclosure includes methods and devices for operating a solid state drive. One method embodiment includes mirroring programming operations such that data associated with a programming operation is programmed to two or more locations in memory of the solid state drive. The method also includes ceasing to mirror programming operations upon an occurrence of a particular event.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 illustrates a block diagram of a solid state drive 120 in accordance with one or more embodiments of the present disclosure. The embodiment of FIG. 1 illustrates the components and architecture of one embodiment of a solid state drive 120. In the embodiment illustrated in FIG. 1, the solid state drive 120 includes a controller 101, an interface 103, and solid state memory arrays 130-1, . . . , 130-N. In one or more embodiments, the solid state drive 120 can include a housing to enclose the solid state drive 120, though such housing is not essential.

Figure 3:
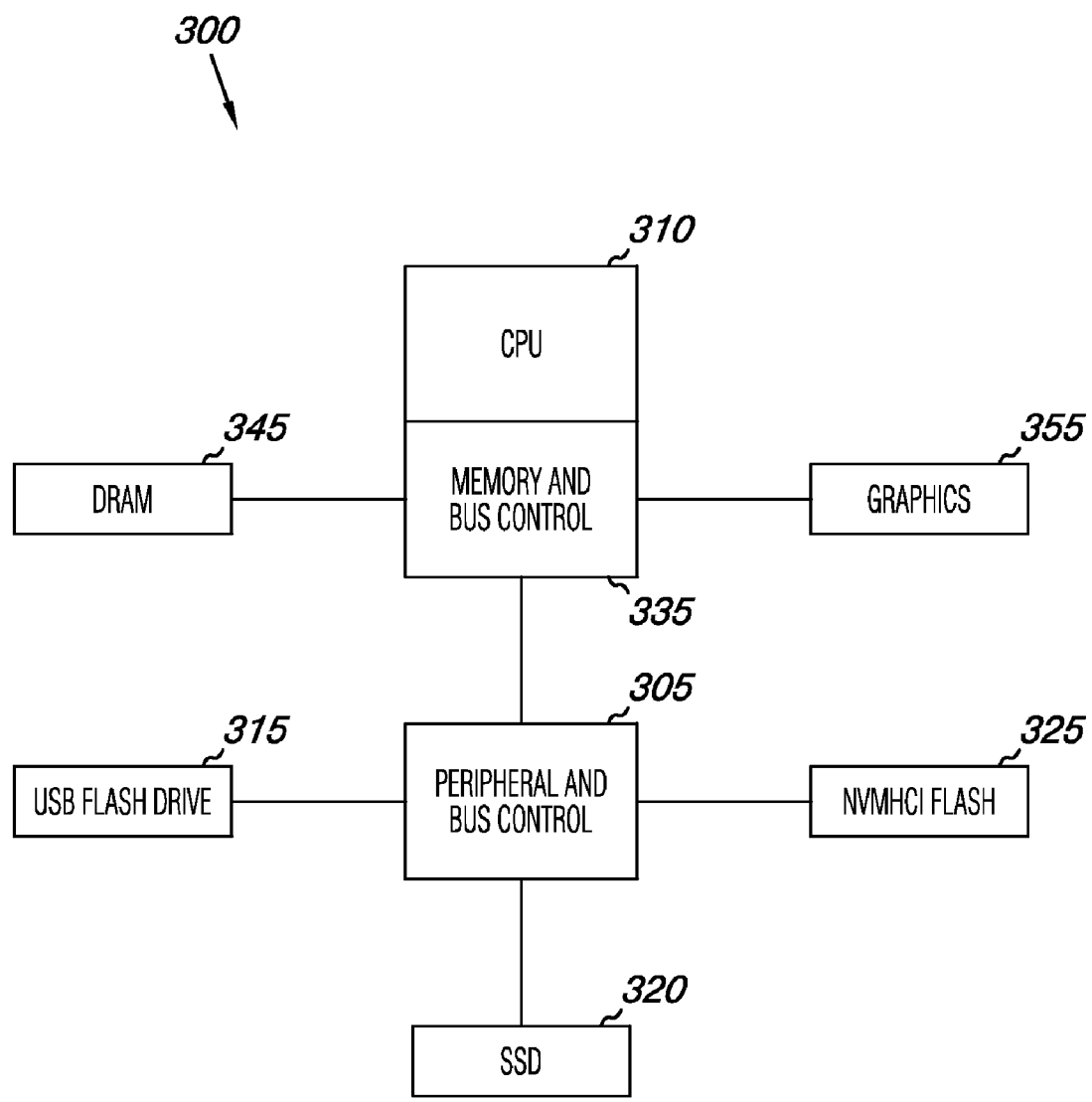
FIG. 3 illustrates a block diagram of a computing system including a solid state drive in accordance with one or more embodiments of the present disclosure.

The interface 103 can be used to communicate information between the solid state drive 120 and another device such as a computing device. For example, when the solid state drive 120 is used for data storage in a computing device, as illustrated in FIG. 3, the interface 103 can be a serial advanced technology attachment (SATA), among others.

The controller 101 can communicate with the solid state memory arrays 130-1, . . . , 130-N to read, write, and erase data on the solid state memory arrays 130-1, . . . , 130-N. The controller 101 can be used to manage the sensing, programming, and erasing of data in the solid state drive 120. Controller 101 can have circuitry that may be one or more integrated circuits and/or discrete components. For one or more embodiments, the circuitry in controller 101 may include control circuitry for controlling access across a number of memory arrays and/or for providing a translation layer between an external host and the solid state drive 120. Thus, a memory controller could selectively couple an I/O connection (not shown in FIG. 1) of a memory array to receive the appropriate signal at the appropriate I/O connection at the appropriate time. Similarly, the communication protocol between a host and the solid state drive 120 may be different than what is required for access of a memory array, e.g., memory array 130-1. Memory controller 101 could then translate the command sequences received from a host into the appropriate command sequences to achieve the desired access to a memory array. Such translation may further include changes in signal voltage levels in addition to command sequences.

The circuitry of controller 101 may further include functionality unrelated to control of a memory array, e.g., array 130-1, such as logic functions as might be performed by an ASIC. Also, the circuitry of controller 101 may include circuitry to restrict read or write access to the solid state drive 120, such as password protection, biometrics or the like. The circuitry of controller 101 may include circuitry to indicate a status of the solid state drive 120. For example, the circuitry of controller 101 may include functionality to determine whether power is being supplied to the solid state drive 120 and whether the solid state drive 120 is currently being accessed, and to display an indication of its status, such as a solid light while powered and a flashing light while being accessed. The circuitry of controller 101 may further include passive devices, such as decoupling capacitors to help regulate power requirements within the solid state drive 120.

Embodiments of the present disclosure can include a number of solid state memory arrays 130-1, . . . , 130-N. The solid state memory arrays 130-1, . . . , 130-N can be various types of volatile and/or non-volatile memory arrays (e.g., Flash or DRAM arrays, among others). Memory arrays 130-1, . . . , 130-N can include a number of memory cells that can be grouped in units. As used herein, a unit can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included one a die. As an example, a 128 GB memory device can include 4314 bytes of data per page, 128 pages per block, 2048 blocks per plane, and 16 planes per device.

The solid state drive can implement wear leveling to control the wear rate on the memory arrays 130-1, . . . , 130-N. As one of ordinary skill in the art will appreciate, wear leveling can increase the life of a solid state memory array since a solid state memory array can experience failure after a number of program and/or erase cycles.

Wear leveling can include dynamic wear leveling to minimize the amount of valid blocks moved to reclaim a block. Dynamic wear leveling can include a technique called garbage collection in which blocks with a number of invalid pages (i.e., pages with data that has been re-written to a different page and/or is no longer needed on the invalid pages) are reclaimed by erasing the block. Static wear leveling includes writing static data to blocks that have high erase counts to prolong the life of the block.

A number of blocks can be designated as spare blocks to reduce the amount of write amplification associated with writing data in the memory array. A spare block can be a block in a memory array that can be designated as a block where data can not be written. Write amplification is a process that occurs when writing data to solid state memory arrays. When randomly writing data in a memory array, the memory array scans for free space in the array. Free space in a memory array can be individual cells, pages, and/or blocks of memory cells that are not programmed. If there is enough free space to write the data, then the data is written to the free space in the memory array. If there is not enough free space in one location, the data in the memory array is rearranged by erasing, moving, and rewriting the data that is already present in the memory array to a new location leaving free space for the new data that is to be written in the memory array. The rearranging of old data in the memory array is called write amplification because the amount of writing the memory arrays has to do in order to write new data is amplified based upon the amount of free space in the memory array and the size of the new data that is to be written on the memory array. Write amplification can be reduced by increasing the amount of space on a memory array that is designated as free space (i.e., where static data will not be written), thus allowing for less amplification of the amount of data that has to be written because less data will have to be rearranged.

Host and/or user traffic and/or program/erase cycles performed by the solid state drive can be monitored, in addition to wear leveling in the solid state drive, to improve performance of the solid state drive. Host and/or user traffic requests can be made by the processor through the controller to read data and/or erase/write data on the solid state drive. Program and/or erase cycles can be monitored to determine the wear rate and life expectancy of the blocks and/or pages in the solid state memory arrays, as a solid state memory arrays can only be erased and written to a finite number of time. Host and/or user traffic trends can be monitored and altered to allow the drive to perform for a desired operational life (e.g., a time period such as hours, days, weeks, years, etc). The solid state drive can monitor and limit the number of program and/or erase cycles performed by the solid state drive, such as to ensure a desired operational life of the drive. The solid state drive can also monitor the number of program and/or erase cycles performed over a particular time period to determine how to calculate the allowable program and/or erase cycle rate for the drive given the a number of space blocks and the desired operational life of the drive.

In addition, the number of spare blocks in the solid state memory arrays of the solid state drive can be controlled to ensure operability over a desired operational life for a desired number of write IOPs per unit time. The percentage of spare blocks can be optimized for the type of data that is being programmed on the solid state drive. A solid state drive that has static data (i.e., data that is stored on the drive for long periods of time without be erased and/or rewritten) can have a lower percentage of spare blocks because there is less need to reclaim blocks in the drive due to the static nature of the data having fewer program and/or erase cycles. In a solid state drive that has dynamic data (i.e., data that is programmed and/or erased more frequently) a higher percentage of spare blocks can be used to reduce the write amplification associated with having to reclaim blocks to perform program and/or erase cycles in the memory array.

Figure 2B:
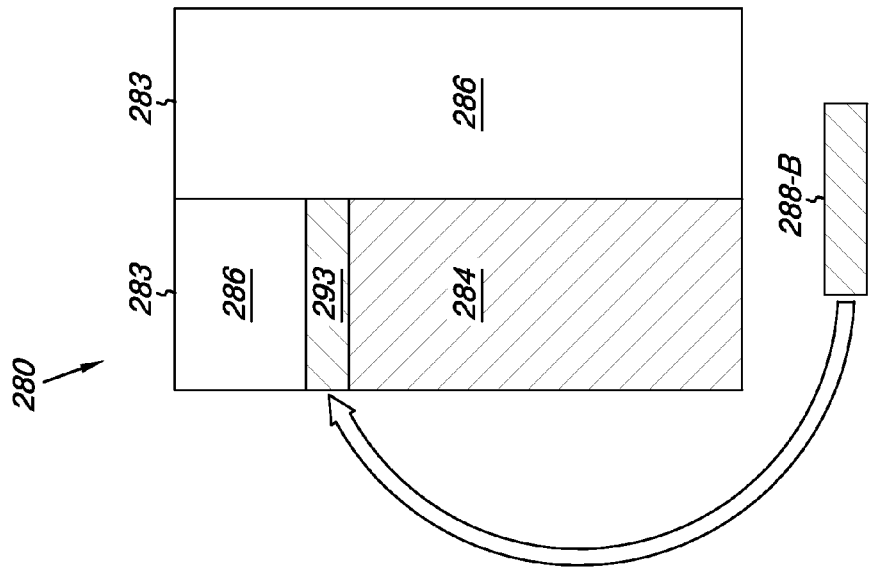
FIGS. 2A and 2B illustrate a block diagram of solid state drive operations in accordance with one or more embodiments of the present disclosure.
Figure 2A:
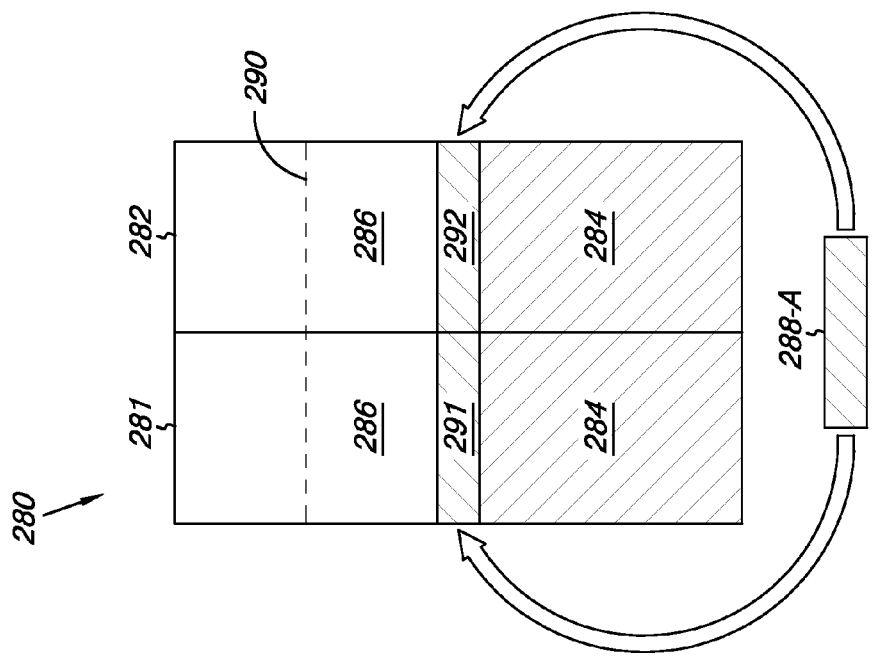

FIGS. 2A and 2B illustrate a block diagram of solid state drive operations in accordance with one or more embodiments of the present disclosure. FIG. 2A illustrates first operations, e.g., operations under a first set of conditions, of at least a portion 280 of a storage capacity of a solid state drive (SSD). FIG. 2B illustrates second operations, e.g., operations under a second set of conditions, of at least a portion 280 of the storage capacity of the SSD. The portion of the storage capacity of the SSD 280 can include all of the storage capacity of the SSD, or a smaller segment thereof. For example, other portions of the storage capacity of the SSD can be addressed such that they are not operated according to the embodiments illustrated in FIGS. 2A and 2B, e.g., spare blocks as described herein.

FIG. 2A illustrates at least a portion 280 of the storage capacity of the SSD that has been logically segregated into a number of first units 281 and a number of second units 282. Control logic, e.g., in a controller on the SSD, can be configured to determine a total number of units in the arrays of the SSD, e.g., upon initialization. The controller can address the first number of units 281 as first units and the second number of units 282 as second units. Although not illustrated in FIG. 2A for ease of illustration, at least a portion of the storage capacity of the SSD can be reserved and addressed as third units, e.g., reserved units. As described herein, a unit can include one or more memory cells, such as a page, block, plane, die, an entire array, or other groups of memory cells. Although the first number of units 281 and the second number of units 282 are illustrated as being adjacent to each other and of the same size, embodiments are not so limited. The first number of units 281 and the second number of units 282 can be of the same or different sizes, e.g., storage capacities. Furthermore, the physical locations on the SSD of the first number of units 281 and the second number of units 282 can be dispersed throughout the SSD, e.g., according to a wear leveling algorithm, and does not necessarily correspond to the illustration in FIG. 2A.

Programming operations can be mirrored such that data 288-A associated with a programming operation is programmed to two or more locations in memory of the SSD. As illustrated in FIG. 2A, a copy of data 288-A can be programmed to one or more of the first units 281 at memory location 291. A second copy of the data 288-A can be programmed to one or more of the second units 282 at memory location 292. Accordingly, data 288-A can be programmed redundantly to a number of locations in the arrays of the SSD. Programming the data 288-A redundantly can include programming two or more copies of the data 288-A to the portion 280 of the storage capacity of the SSD. In one or more embodiments, data can be programmed to two or more locations simultaneously such that the SSD is less likely to incur a performance penalty associated with such redundant programming. For example, data 288-A could be programmed to location 291 in a first array of memory cells on the SSD at the same time that the data 288-A is programmed to location 292 in a second array of memory cells on the SSD. The first and second arrays can be configured to program data simultaneously. Further discussion of simultaneous operations in a memory device can be found in commonly assigned U.S. patent application Ser. No. 12/259,380, entitled "Logical Unit Operation," including at least one common inventor, Troy Manning, filed on the same date herewith. Embodiments are not limited to programming data redundantly to separate arrays, as data can be programmed redundantly within a single array.

In one or more embodiments, the functionality of the SSD associated with mirroring programming operations such that data is programmed redundantly can be optionally enabled on the SSD. For example, mirroring can be enabled by one or more commands issued by a controller, one time programmable (OTP) commands, a physical switch on the SSD, by a user interface, e.g., a graphical user interface (GUI), fuses, antifuses, or by one or more settings that can be adjusted prior to shipping the SSD to a customer, among other enabling mechanisms. Such mirroring may be likened to a temporary internal RAID for the SSD. As will be described in more detail below, such mirroring can be temporary because the SSD does not necessarily program data redundantly over its service live, nor are redundant copies of data necessarily retained for the service life of the SSD. While data is stored redundantly, the effects of a failure associated with one copy of the data, such as a programming or sensing failure, may be reduced by the availability of one or more additional copies of the data. However, as failures associated with solid state devices may tend to occur and/or be detected in the early life of the device, the device may take advantage of the "RAID" in its early life. Subsequently, the device may store data singly and/or erase redundant copies of data to increase its effective capacity for later life. The "RAID" is internal to the SSD because it does not utilize multiple SSDs, unlike a conventional RAID that utilizes multiple hard disks.

As will be appreciated, once data has been programmed to a "location" in memory, the physical location, e.g., the memory cells to which the data is programmed, can change, for example, according to wear leveling, anti write amplification, or other algorithms affecting memory management on the SSD. Although the first number of units 281 and the second number of units 282 are illustrated having the same amount of used space 284 and free space 286, embodiments are not so limited. The amount of free space 286 in the first units 281 can change at a rate equal to or different than the amount of free space 286 in the second units 282. Likewise, the amount of used space 284 in the first units 281 can change at a rate equal to or different than the amount of free space 286 in the second units 282.

In one or more embodiments, sensing operations can be performed on the first units 281 while the portion 280 of the storage capacity is segregated. Accordingly, if data 288-A is to be sensed from the SSD, it can be sensed from location 291, as illustrated in FIG. 2A. That is, although data 288-A can be programmed redundantly to two or more locations, it can be sensed from one location to improve operating performance over sensing more than one copy of the data. In one or more embodiments, the controller can be configured to perform sensing operations on a second copy of data after a first copy of data is associated with an error that is not corrected by error correction code (ECC).

The copy of data to be sensed is referred to herein as the primary copy, while other copies are referred to as redundant copies. In one or more embodiments, if a sensing error that is not corrected by ECC is associated with sensing the primary copy of the data, then the redundant copy of the data can be sensed. As described herein, more than one copy of the data can be programmed simultaneously. Accordingly, if a programming error that is not corrected by ECC is associated with programming the primary copy of the data, then the redundant copy of the data can be sensed.

In one or more embodiments, erasing operations can be mirrored such that data associated with an erasing operation is erased from two or more locations to which it was programmed in memory of the SSD. For example, while the portion 280 of the storage capacity is segregated, an erasing operation of data 288-A can be performed at location 291 in the first units 281 and at location 292 in the corresponding second units 282.

In one or more embodiments, the SSD can be operated as described with respect to the embodiment illustrated in FIG. 2A, e.g., a temporary internal RAID, until the occurrence of a particular event. The particular event can include the SSD, or a portion thereof, reaching a threshold of used space, a programming error that is not corrected by ECC, or a sensing error that is not corrected by ECC, among other events.

In one or more embodiments, the particular event can include the amount of used space 284 of the portion 280 of the storage capacity reaching a threshold 290 amount. The particular location of threshold 290 as illustrated in FIG. 2A should not be taken in a limiting sense. The threshold 290 can be set to a number of different locations, including at the top of the portion of the storage capacity 280, such that the threshold can be reached when either or both of the first units 281 and second units 282 comprise used space 284. In one or more embodiments, the threshold 290 can be reached when all of the first units 281 comprise used space 284, or when all of the second units 282 comprise used space 284. In one or more embodiments, the threshold 290 of used space can be half of the total space of the portion 280 of storage capacity. For example, if the portion 280 of storage capacity is equal to a terabyte, and the terabyte is split evenly such that there are 500 gigabytes of first units 281 and 500 gigabyte of second units 282, then the threshold can be 500 gigabyte of used space 284. Such a 500 gigabyte threshold (half of the total space of the portion 280 of the storage capacity) can be reached when either or both of the first units 281 and the second units 282 comprise 500 gigabyte of used space 284. The threshold 290 need not be set at the same level for first units 281 and second units 282. Furthermore, the threshold 290 does not represent a particular location in memory, but rather an amount of memory, e.g., a percentage of memory. As described herein, the amount of used space 284 and free space 286 for first units 281 and second units 282 can change independently and do not have to be equal as illustrated in FIG. 2A.

In one or more embodiments, the particular event can include an error that is not corrected by ECC. In such embodiments, operation of the temporary internal RAID may be suspended or modified. Suspending the temporary internal RAID can result in device operation as described with respect to FIG. 2B, e.g., desegregating the portion 280 of the storage capacity and programming data singly, among other operational differences. Modifying the temporary internal RAID is described below.

In one or more embodiments the controller can be configured to access ECC and address a particular unit as invalid if an error that is not corrected by ECC is associated with the unit, e.g., a sensing or programming error, among others, as described herein. Addressing a unit as invalid can include programming an indicator that the unit is invalid to one or more locations in the invalid unit, removing that unit's physical or logical address from a register, or adding that unit's physical or logical address to a table of invalid units, such that the unit is no longer utilized, e.g., programmed, sensed, erased, etc., by the SSD. For example, if the particular unit associated with the error is a particular first unit, then the controller can perform subsequent operations on a corresponding particular second unit. In one or more embodiments, the controller can address the particular second unit as the particular first unit after the particular first unit has been addressed as invalid. That is, the controller can replace the address associated with an invalid first unit with an address associated with the second unit such that when the SSD attempts to utilize the first unit, it actually utilizes the second unit. In such embodiments, the controller can address a particular third unit as the particular second unit. That is, a redundant unit can replace a primary unit, and a reserve unit can replace a redundant unit. In such embodiments, a reserved unit can be programmed with a copy of data stored in the redundant unit.

FIG. 2B illustrates a portion 280 of the storage capacity of the SSD after it has been logically desegregated to include a total number of units 283. The portion 280 illustrated in FIG. 2B can be analogous to portion 280 illustrated in FIG. 2A. In one or more embodiments the total number of units 283 can be equal to the number of first units 281 and the number of second units 282. The total number of units 283 may be referred to herein as "first units" because their functionality, e.g., how they are operated on by the controller of the SSD, is analogous to the operation of first units 281 as described above. For example, data can be programmed to and sensed from the first units 283, e.g., units 283 can operate as primary units.

In one or more embodiments, the portion 280 of the storage capacity can be logically desegregated upon an occurrence of a particular event. Examples of such particular events are described herein. In one or more embodiments some or all of the first units 281 and corresponding second units 282 can be logically desegregated. For example, when the particular event is an error that is not corrected by ECC, the units corresponding to the error can be desegregated, while the remainder of the portion 280 of the storage space remains segregated. Programming operations can cease to be mirrored upon the occurrence of the particular event such that data 288-B is programmed singly, e.g., to one location 293 in the number of units 283. That is, a first, e.g., primary copy of data 288-B can be programmed without programming a second, e.g., redundant, copy of the data 288-B. Accordingly, erasing operations can also cease to be mirrored upon the occurrence of the particular event. That is, an erasing operation performed on data 288-B can be performed in one location 293 in memory.

In one or more embodiments, previously segregated second units 282 can be used as free space 286 for later programming. That is, the previously segregated second units 282 can be erased and addressed as free space 286. In one or more embodiments where second units 282 are addressed as first units 281 after occurrence of the particular event, the newly addressed first units 281 can be addressed as free space 286. For example, when the threshold 290 is set such that it is reached when the first units 281 comprise used space, the second units 282 can be erased after the threshold 290 is reached. In such an example data 288-B could be programmed to the previous "second units" 282, now part of the "total units" 283. That is, the temporary internal RAID can be suspended and the SSD can store single copies of data rather than primary and redundant copies of data.

FIG. 3 illustrates a block diagram of a computing system 300 including a solid state drive (SSD) 320 in accordance with one or more embodiments of the present disclosure. SSD 320 can be analogous to the solid state drive described herein, e.g., solid state drive 120 in FIG. 1. SSD 320 can have an interface, e.g., a SATA interface to a peripheral and bus control 305, which can be linked to memory and bus control 335, which can interface with a processor, e.g., CPU 310. Peripheral and bus control 305 can connect to a number of devices, such as a flash drive 315, e.g., using a universal serial bus (USB) interface, and a non-volatile memory host control interface (NVMHCI) flash memory 325, e.g., using a peripheral component interconnect express (PCIe) interface. Memory and bus control 335 can connect to a number of devices such as memory, e.g., DRAM 345, e.g., using a double-data-rate three (DDR3) interface, and graphics components 355, e.g., using a PCIe interface. As the reader will appreciate, a solid state drive 320 can be used in lieu of a hard disk drive (HDD) in a number of different computing systems. The computing system 300 illustrated in FIG. 3 is one example of such a system.

Figure 4:
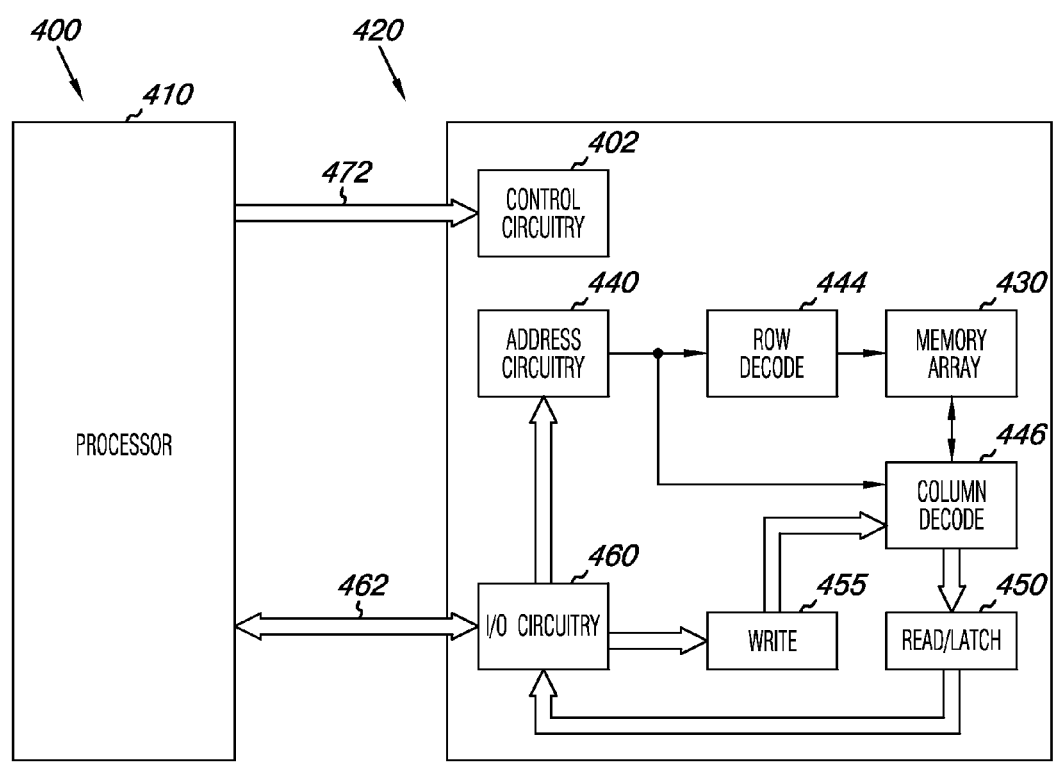
FIG. 4 is a functional block diagram of an electronic memory system having at least one solid state drive operated in accordance with one or more embodiments of the present disclosure.

FIG. 4 is a functional block diagram of an electronic memory system 400 having at least one solid state drive operated in accordance with one or more embodiments of the present disclosure. Memory system 400 includes a processor 410 coupled to a solid state drive 420 that includes a number of memory arrays 430 of non-volatile cells. Although only one memory array 430 is illustrated, embodiments of the present disclosure can include a number of memory arrays 430 on a solid state drive 420, e.g., as illustrated in FIG. 1. The memory system 400 can include separate integrated circuits or both the processor 410 and the solid state drive 420 can be on the same integrated circuit. The processor 410 can be a microprocessor or some other type of controlling circuitry such as an application-specific integrated circuit (ASIC).

The solid state drive 420 includes a number of arrays of non-volatile memory cells 430, which can be floating gate flash memory cells with a NAND architecture, as will be understood by one of ordinary skill in the art. Such an architecture can include control gates of memory cells of a "row" coupled with a word line, and drain regions of the memory cells of a "column" coupled to bit lines. In such an architecture, the source regions of the memory cells can be coupled to source lines. As will be appreciated by those of ordinary skill in the art, the manner of connection of the memory cells to the bit lines and source lines depends on whether the array is a NAND architecture, a NOR architecture, an AND architecture, or some other memory array architecture.

The embodiment of FIG. 4 includes address circuitry 440 to latch address signals provided over I/O connections 462 through I/O circuitry 460. Address signals are received and decoded by a row decoder 444 and a column decoder 446 to access the memory array 430. In light of the present disclosure, it will be appreciated by those skilled in the art that the number of address input connections depends on the density and architecture of the memory array 430 and that the number of addresses increases with both increased numbers of memory cells and increased numbers of memory blocks and arrays.

The solid state drive 420 senses data in the memory array 430 by sensing voltage and/or current changes in the memory array columns using sense/buffer circuitry that in this embodiment can be read/latch circuitry 450. The read/latch circuitry 450 can read and latch a page, e.g., a row, of data from the memory array 430. I/O circuitry 460 is included for bi-directional data communication over the I/O connections 462 with the processor 410. Write circuitry 455 is included to write data to the memory array 430.

A number of memory arrays 430 can each include one or more separate row decoders 444 and column decoders 446. In one or more embodiments, the memory arrays 430 can include separate read/latch circuitry 450, write circuitry 455, address circuitry 440, and I/O circuitry 460. In one or more embodiments, memory arrays 430 can share one or more of read/latch circuitry 450, write circuitry 455, address circuitry 440, and I/O circuitry 460. For ease of illustration, only one of each is shown in FIG. 4.

Control circuitry 470 decodes signals provided by control connections 472 from the processor 410. These signals can include chip signals, write enable signals, and address latch signals that are used to control the operations on the memory array 430, including data sensing, data write, and data erase operations, as described herein. In one or more embodiments, the control circuitry 470 is responsible for executing instructions from the processor 410 to perform the operations according to embodiments of the present disclosure. The control circuitry 470 can be a state machine, a sequencer, or some other type of controller. Controller 101 illustrated in FIG. 1 can include the functionality of one or more of control circuitry 470, address circuitry 440, and I/O circuitry 460 as described with respect to FIG. 4. It will be appreciated by those skilled in the art that additional circuitry and control signals can be provided, and that the memory device detail of FIG. 4 has been reduced to facilitate ease of illustration.

CONCLUSION

The present disclosure includes methods and devices for operating a solid state drive. One method embodiment includes mirroring programming operations such that data associated with a programming operation is programmed to two or more locations in memory of the solid state drive. The method also includes ceasing to mirror programming operations upon an occurrence of a particular event.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one.

Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a solid state drive, comprising:
   mirroring programming operations such that data associated with a programming operation is programmed to two or more locations in memory of the solid state drive; and
   ceasing mirroring programming operations in response to an occurrence of a particular event, wherein the particular event comprises the solid state drive reaching a threshold of used space.

2. The method of claim 1, wherein mirroring programming operations includes programming a first copy of data to a first location in memory and programming a second copy of data to a second location in memory.

3. The method of claim 2, wherein ceasing to mirror programming operations includes programming the first copy of data without programming the second copy of data.

4. The method of claim 1, wherein the method includes:
mirroring erasing operations such that data associated with an erasing operation is erased from two or more locations to which it was programmed in memory of the solid state drive; and
ceasing to mirror erasing operations in response to the occurrence of the particular event.

5. The method of claim 1, wherein the particular event is preceded by one selected from the group of preceding events including:
a programming error that is not corrected by error correction code (ECC); and
a sensing error that is not corrected by ECC; and
wherein the method includes ceasing mirroring programming operations in response to the preceding event.

6. The method of claim 1, wherein mirroring programming operations includes mirroring programming operations such that data associated with the programming operation is simultaneously programmed to two or more locations in memory of the solid state drive.

7. A method for operating a solid state drive, comprising:
logically segregating at least a portion of a storage capacity of the solid state drive into a number of first units and a number of corresponding second units;
programming a copy of data to one or more of the number of first units and a copy of the data to one or more of the number of corresponding second units; and
logically desegregating one or more of the number of first units and the one or more corresponding second units in response to an occurrence of a particular event, wherein the particular event comprises the solid state drive reaching a threshold of used space.

8. The method of claim 7, wherein the method includes performing a sensing operation on at least one of the number of first units without performing a sensing operation on a corresponding second unit while the portion of the storage capacity is segregated.

9. The method of claim 7, wherein the method includes performing an erasing operation on at least one of the number of first units and on a corresponding second unit while the portion of the storage capacity is segregated.

10. The method of claim 7, wherein:
the method includes logically desegregating all of the number of first units and the number of second units.

11. The method of claim 10, wherein the method includes using the number of previously segregated second units as free space for programming.

12. The method of claim 7, wherein:
the particular event is preceded by an error selected from the group including:
a programming error that is not corrected by error correction code (ECC) in a first unit; and
a sensing error that is not corrected by ECC in a first unit; and
the method includes logically desegregating the first unit and the second unit corresponding to the error.

13. The method of claim 12, wherein the method includes:
discontinuing use of the first unit corresponding to the error, wherein use of the first unit includes performing at least one of a sensing operation and a programming operation on the first unit; and
performing a sensing operation on the second unit corresponding to the error.

14. The method of claim 12, wherein the method includes:
reserving at least a portion of the storage capacity as third units; and
using the second unit corresponding to the error as a new first unit; and
using a third unit as a new second unit.

15. A method for operating a solid state drive, comprising:
programming data redundantly in response to more than a threshold amount of a total space of at least a portion of a storage capacity of the solid state drive comprising free space; and
programming data singly in response to less than the threshold amount of the total space comprising free space.

16. The method of claim 15, wherein the threshold amount is half of the total space.

17. The method of claim 15, wherein:
programming data redundantly includes programming two or more copies of data associated with a programming operation to the portion of the storage capacity of the solid state drive; and
programming data singly includes programming one copy of data associated with the programming operation.

18. The method of claim 15, wherein programming data redundantly includes programming a primary copy of data and a redundant copy of data.

19. The method of claim 18, wherein the method includes:
performing sensing operations on the primary copy of data; and
performing sensing operations on the redundant copy of data if a sensing error that is not corrected by error correction code (ECC) is associated with sensing the primary copy.

20. The method of claim 18, wherein the method includes performing a sensing operation on the redundant copy if a programming error that is not corrected by ECC is associated with programming the primary copy.

21. A solid state memory device, comprising:
a number of solid state memory arrays; and
a controller coupled to the number of solid state memory arrays and configured to:
program data redundantly to a number of locations in the arrays before an amount of used space in the arrays reaches a particular threshold; and
program data singly to a location in the arrays in response to the amount of used space in the arrays reaching the particular threshold.

22. The device of claim 21, wherein the controller is configured to:
program data redundantly by programming a first copy of data and a second copy of data; and
program data singly by programming one copy of data.

23. The device of claim 22, wherein the controller is configured to address the number of locations in the arrays storing second copies of data as free space in response to the amount of used space in the arrays reaching the particular threshold.

24. The device of claim 22, wherein the controller is configured to perform sensing operations on first copies of data.

25. The device of claim 22, wherein the controller is configured to perform sensing operations on a second copy of particular data if a first copy of the particular data is associated with an error that is not corrected by error correction code (ECC).

26. The device of claim 21, wherein the configuration of the controller to program data redundantly to the number of locations in the arrays before the amount of used space in the arrays reaches the particular threshold is optionally enabled.

27. A solid state memory device, comprising:
   a number of solid state memory arrays; and
   a controller coupled to the number of solid state memory arrays and configured to:
      address a first number of units in the arrays as first units and a second number of units as second units;
      program a copy of data to a first unit and a copy of the data to a second unit during programming operations; and
      address the first and the second units as first units in response to either or both of the first units and the second units reaching a threshold of used space.

28. The device of claim 27, wherein the threshold of used space is selected from the group including when all of the first units comprise used space, and when all of the second units comprise used space.

29. The device of claim 27, wherein the controller is configured to perform sensing operations on first units.

30. The device of claim 27, wherein the controller is configured to:
   determine a total number of units in the arrays; and
   address a number of the total number of units as third units.

31. The device of claim 30, wherein the controller is configured to:
   access error correction code (ECC); and
   address a unit as invalid if an error that is not corrected by ECC is associated with the unit.

32. The device of claim 31, wherein the controller is configured to perform operations on a particular second unit corresponding to a particular first unit that has been addressed as invalid.

33. The device of claim 31, wherein the controller is configured to:
   address the particular second unit as the particular first unit if the particular first unit has been addressed as invalid; and
   address a particular third unit as the particular second unit.

34. The device of claim 27, wherein the controller is configured to erase the second units when the second units are addressed as first units.

35. The device of claim 27, wherein the controller is configured to address the second units as free space if the second units are addressed as first units.

36. A solid state memory device, comprising:
   a number of solid state memory arrays; and
   a controller coupled to the number of solid state memory arrays and configured to:
      address a first portion of a number of units in a memory array as a number of primary units and a second portion as a number of redundant units;
      program first data to a particular primary unit and a particular redundant unit; and
      erase the particular redundant unit and program second data thereto in response to the number of primary units comprising used space.

37. The device of claim 36, wherein the controller is configured to:
   sense first data from the particular primary unit; and
   sense first data from the particular redundant unit if a sensing operation performed on the particular primary unit results in an error.

38. The device of claim 37, wherein the controller is configured to:
   reserve at least one unit in the memory array;
   address the particular redundant unit as the particular primary unit if an operation performed on the particular primary unit results in an error;
   program first data to a reserved unit; and
   address the reserved unit as the particular redundant unit.

39. The device of claim 36, wherein the controller is configured to erase first data from the particular primary unit and the particular redundant unit.

* * * * *